(12) United States Patent
Takai

(10) Patent No.: US 8,647,174 B2
(45) Date of Patent: Feb. 11, 2014

(54) SEMICONDUCTOR WAFER POLISHING METHOD AND POLISHING PAD SHAPING JIG

(75) Inventor: Hiroshi Takai, Tokyo (JP)

(73) Assignee: Sumco Corporation, Tokyo (JP)

( * ) Notice: Subject to any disclaimer, the term of this patent is extended or adjusted under 35 U.S.C. 154(b) by 304 days.

(21) Appl. No.: 13/262,855

(22) PCT Filed: Apr. 26, 2010

(86) PCT No.: PCT/JP2010/057328
§ 371 (c)(1),
(2), (4) Date: Oct. 4, 2011

(87) PCT Pub. No.: WO2010/128631
PCT Pub. Date: Nov. 11, 2010

(65) Prior Publication Data
US 2012/0028547 A1    Feb. 2, 2012

(30) Foreign Application Priority Data
May 8, 2009 (JP) ................................. 2009-113688

(51) Int. Cl.
*B24B 1/00* (2006.01)
(52) U.S. Cl.
USPC ............... 451/41; 451/72; 451/262; 451/267; 451/443; 451/444; 451/490
(58) Field of Classification Search
USPC .............. 451/41, 72, 267, 262, 443, 444, 561
See application file for complete search history.

(56) References Cited

U.S. PATENT DOCUMENTS

| 4,555,873 | A | * | 12/1985 | Smith | 451/21 |
| 5,605,499 | A | | 2/1997 | Sugiyama et al. | |
| 6,554,689 | B2 | * | 4/2003 | Ohkuma et al. | 451/262 |
| 6,648,735 | B2 | * | 11/2003 | Miyashita et al. | 451/41 |
| 6,748,571 | B2 | * | 6/2004 | Miwa | 702/59 |
| 2002/0102931 | A1 | * | 8/2002 | Ohkuma et al. | 451/262 |
| 2005/0124264 | A1 | * | 6/2005 | Tominaga et al. | 451/41 |
| 2008/0070483 | A1 | * | 3/2008 | Roettger et al. | 451/37 |
| 2008/0188166 | A1 | * | 8/2008 | Godshall | 451/262 |

FOREIGN PATENT DOCUMENTS

| JP | 07-297195 | 11/1995 |
| JP | 2000-202769 | 7/2000 |
| JP | 2000-235941 | 8/2000 |
| JP | 2002-187059 | 7/2002 |
| JP | 2004-047876 | 2/2004 |
| JP | 2007-268679 | 10/2007 |

* cited by examiner

*Primary Examiner* — George Nguyen
(74) *Attorney, Agent, or Firm* — Greenblum & Bernstein, P.L.C.

(57) ABSTRACT

Disclosed is a semiconductor wafer polishing method for polishing the surfaces to be polished of semiconductor wafers by use of polishing pads (16, 17) provided on fixing plates by relative movement of the polishing pads and the semiconductor wafers held by carriers. The shaping surfaces (25) of a polishing pad shaping jig (21) are shaped by inverting, with respect to ideal shapes, the shapes of the surfaces to be polished of each semiconductor wafer when the surfaces are polished by use of the polishing pads (16, 17) before shaping, and the shapes of the shaping surfaces of the polishing pad shaping jig are transferred to the pad surfaces (16A and 17A) of the respective polishing pads (16, 17). The surfaces to be polished of each semiconductor wafer are polished by use of the pad surfaces.

9 Claims, 5 Drawing Sheets

FIG. 6-A
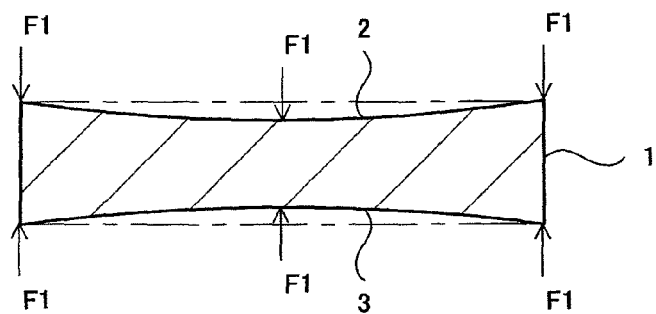
FIG. 6-B
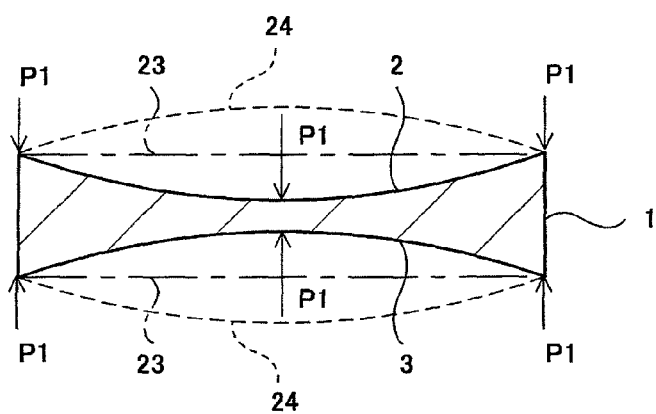
FIG. 7
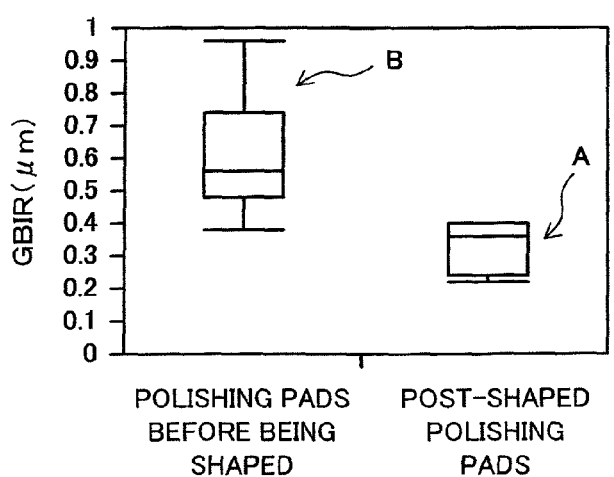

FIG. 10-A
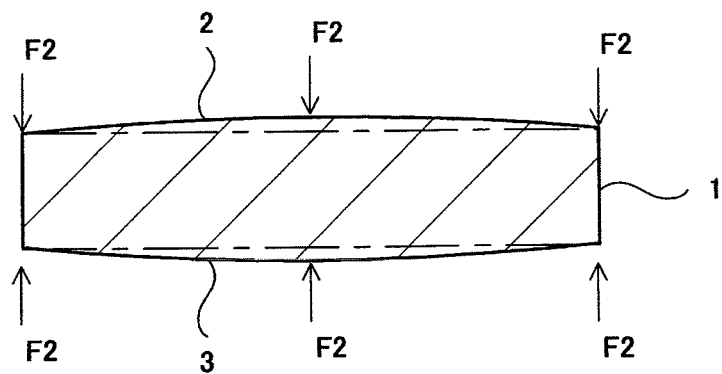
FIG. 10-B
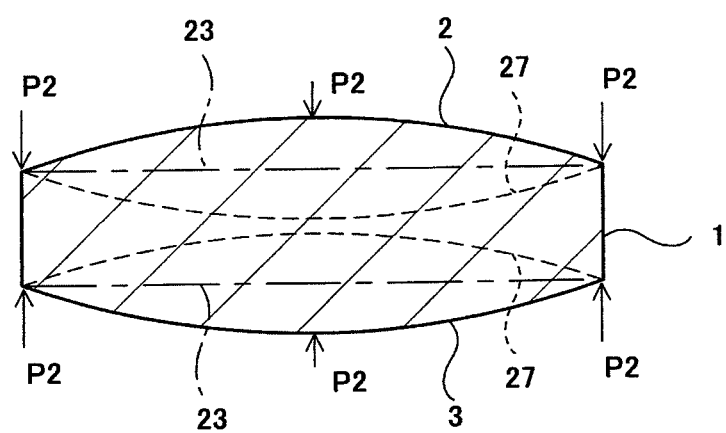

SEMICONDUCTOR WAFER POLISHING METHOD AND POLISHING PAD SHAPING JIG

TECHNICAL FIELD

The present invention relates to a semiconductor wafer polishing method for polishing surfaces to be polished of a semiconductor wafer using polishing pads provided on surface plates, and a polishing pad shaping jig used for the semiconductor wafer polishing method.

BACKGROUND ART

When a circuit is formed on a surface of a semiconductor wafer to manufacture a semiconductor device, if flatness of the surface of the semiconductor wafer is low, focusing during exposure is partially inaccurate in photolithography steps for forming the circuit, which can affect the formation of a fine pattern of the circuit. Therefore, the surface and the back surface of the semiconductor wafer require remarkably high flatness.

In order to achieve the remarkably high flatness of the surface and the back surface of the semiconductor wafer, the surface and the back surface of the semiconductor wafer need to be polished with high accuracy, and a double side polishing apparatus is known therefor. The double side polishing apparatus polishes the surface and the back surface of the semiconductor wafer at the same time by relative movement between polishing pads provided on surface plates and the semiconductor wafer held in a carrier.

In the double side polishing apparatus, when the thickness of the semiconductor wafer to be polished is larger than the thickness of the carrier, the semiconductor wafer lies between the polishing pads and thus the polishing of the outer periphery of the semiconductor wafer is excessively promoted. Consequently, droop occurs at the outer periphery (edge) of the surface and the back surface of the semiconductor wafer and the flatness of the semiconductor wafer may be deteriorated.

In order to prevent the droop at the outer periphery, there is disclosed in Patent Document 1 a technique for setting the thickness of the carrier to be substantially matched with a target value of the final thickness of the semiconductor wafer and distributing a surface pressure acting on the outer periphery of the semiconductor wafer from the polishing pads over the carrier, thereby preventing the droop at the outer periphery of the semiconductor wafer.

However, even by the double side polishing apparatus which adjusts the thickness of the carrier as described above, the center of the polished semiconductor wafer may be concave to be largely depressed or may be convex to be largely expanded due to the shape of the surface plates or an influence by an applied state of the polishing pads provided on the surface plates and thus the flatness of the surface and the back surface of the polished semiconductor wafer cannot achieve a desired value.

[Patent Document 1] Japanese Patent Application Laid-Open No. 2000-235941

DISCLOSURE OF THE INVENTION

Bearing in mind the aforementioned circumstances, it is an object of the present invention to provide a semiconductor wafer polishing method and a polishing pad forming jig which allows the polishing surface of the semiconductor wafer at a preferable flatness.

The semiconductor wafer polishing method of the present invention is featured as indicated below. In a semiconductor wafer polishing method, a surface to be polished of the semiconductor wafer is polished by polishing pads through relative movement between the polishing pads and the semiconductor wafer. The semiconductor wafer polishing method includes: reversing the shape of the polished surfaces of the semiconductor wafer when being polished by the polishing pads for an ideal shape, thereby forming a shaping surface of a polishing pad shaping jig; transferring the shape of the shaping surface of the polishing pad shaping jig to the polishing pads; and polishing the surfaces to be polished of the semiconductor wafer by the post-shaped polishing pads.

The polishing pad shaping jig according to the present invention is mounted on a semiconductor wafer polishing apparatus in order to change a surface pressure acting on the semiconductor wafer to be polished by the polishing pads, thereby pressing and shaping the polishing pads, and the shaping surface thereof is formed in a shape in which the shape of the polished surfaces of the semiconductor wafer polished by the polishing pads before being shaped is reversed for the ideal shape. A hard coating layer is provided on the shaping surfaces.

In the semiconductor wafer polishing method and the polishing pad shaping jig according to the present invention, since the shape of the polished surfaces of the semiconductor wafer when being polished by the polishing pads before being shaped is reversed for the ideal shape to form the shaping surface of the polishing pad shaping jig and the polishing pads to which the shape of the polishing surface is transferred are used to polish the surfaces to be polished of the semiconductor wafer, a surface pressure acting on the surfaces to be polished of the semiconductor wafer by the polishing pads can be optimized and thus the surfaces to be polished of the semiconductor wafer can be polished by the polishing pads at preferable flatness. The hard coating layer is provided on the shaping surface to form the polishing pad shaping jig excellent in wear resistance.

BRIEF DESCRIPTION OF THE DRAWINGS

FIG. 6 shows a semiconductor wafer polished by the double side polishing apparatus of FIG. 1, where FIG. 6-A is a cross-sectional view when the shaped polishing pads of FIG. 5 are used and FIG. 6-B is a cross-sectional view when the polishing pads before being shaped are used;

FIG. 7 is a graph indicating flatness (GBIR) of surfaces and back surfaces of multiple semiconductor wafers polished by pre-shaped and post-shaped polishing pads, respectively;

FIG. 10 shows a semiconductor wafer polished by the double side polishing apparatus, where FIG. 10-A is a cross-sectional view when the shaped polishing pads of FIG. 9 are used and FIG. 10-B is a cross-sectional view when the polishing pads before being shaped are used.

BEST MODES FOR CARRYING OUT THE INVENTION

The best modes for carrying out the present invention will be described below with reference to the drawings.

Figure 1:
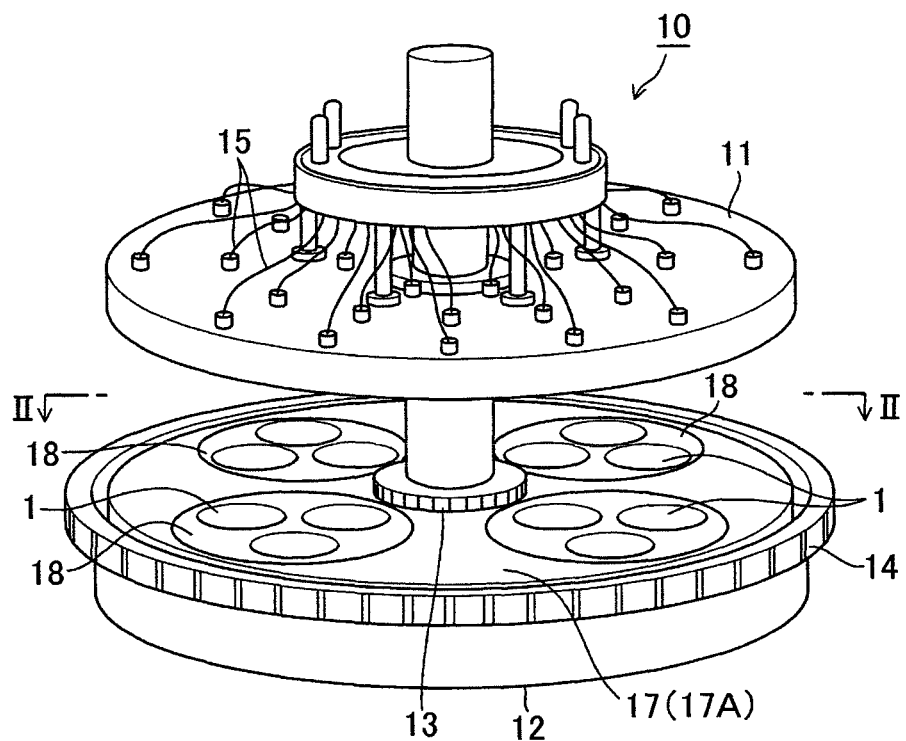
FIG. 1 is a perspective view showing a double side polishing apparatus embodying one embodiment of a semiconductor wafer polishing method according to the present invention.
Figure 2:
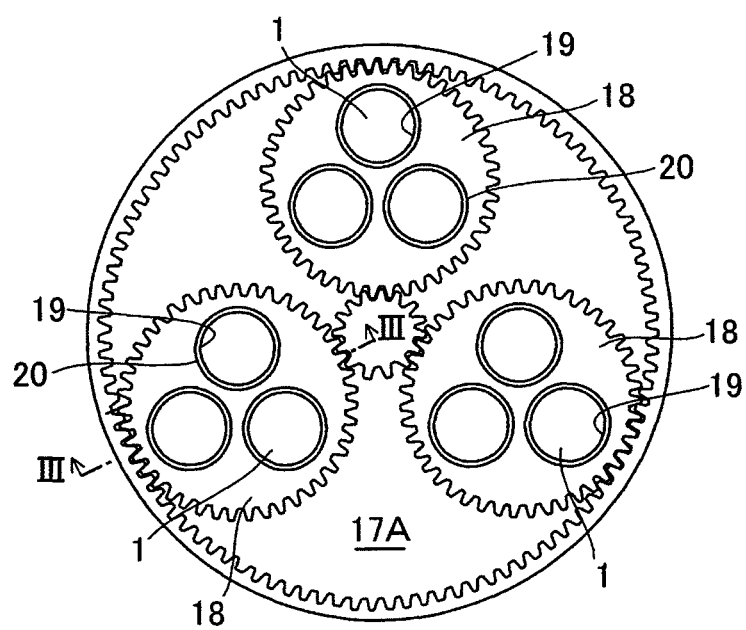
FIG. 2 is a view taken along line II-II of FIG. 1.
Figure 3:
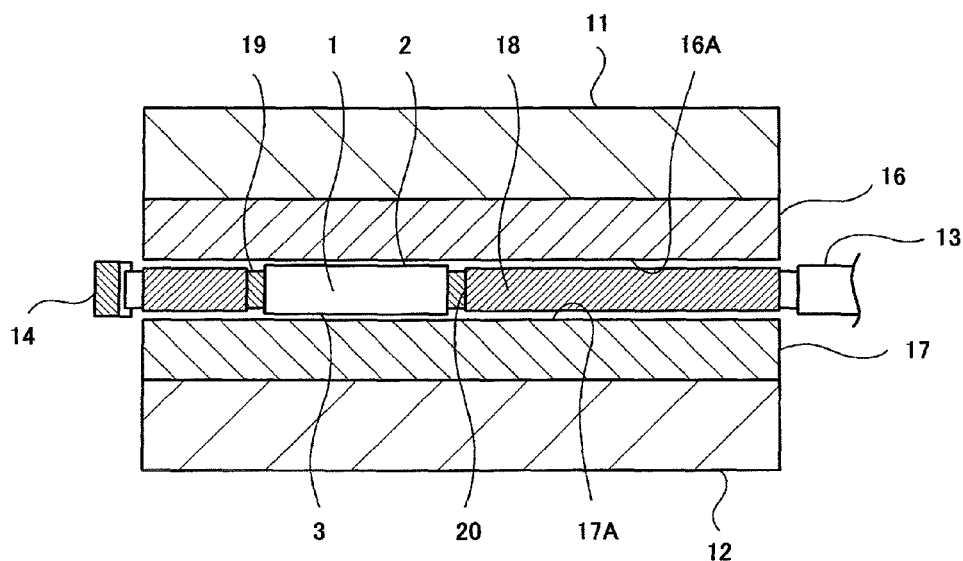
FIG. 3 is a cross-sectional view taken along line III-III of FIG. 2.

FIG. 1 is a perspective view showing a double side polishing apparatus embodying one embodiment of a semiconductor wafer polishing method according to the present invention. FIG. 2 is a view taken along line II-II of FIG. 1. FIG. 3 is a cross-sectional view taken along line of FIG. 2.

The double side polishing apparatus 10 shown in FIGS. 1 to 3 includes an annular lower surface plate 12 horizontally supported, an upper surface plate 11 arranged above and opposite to the lower surface plate 12, an inner gear 13 as sun gear arranged inside the lower surface plate 12, and an outer gear 14 as ring-shaped internally-toothed gear arranged outside the lower surface plate 12.

The lower surface plate 12 is driven by a drive motor (not shown). The upper surface plate 11 is provided to be upward and downward movable, and is driven to rotate in the reverse direction to the lower surface plate 12 by a different drive motor (not shown) from the drive motor for driving the lower surface plate 12. Further, the upper surface plate 11 is equipped with polishing liquid supply systems 15 for supplying a polishing liquid (polishing slurry) mixed with abrasive grains between the upper surface plate 11 and the lower surface plate 12.

The inner gear 13 is driven by a different drive motor from the drive motors for driving the upper surface plate 11 and the lower surface plate 12, respectively. The outer gear 14 is also driven by a different drive motor from the drive motors for driving the upper surface plate 11 and the lower surface plate 12, respectively.

Polishing pads 16 and 17 are applied to the opposing surfaces of the upper surface plate 11 and the lower surface plate 12, respectively. The polishing pads 16 and 17 are made of a nonwoven cloth impregnating urethane resin therein, or urethane foam.

A plurality of (four, for example) carriers 18 are arranged around the inner gear 13 on the lower surface plate 12. Each carrier 18 meshes with the inner gear 13 and the outer gear 14 and functions as planetary gear movable along with the rotation of the lower surface plate 12. The carrier 18 is eccentrically provided with a plurality of (three, for example) holes 20 each housing the semiconductor wafer 1 via a resin ring 19. The inner diameter of the resin ring 19 is set to be slightly larger than the outer diameter of the semiconductor wafer 1 so that the semiconductor wafer 1 is rotatably provided inside the resin ring 19.

The thickness of each carrier 18 is set to match with a target value of the final thickness of the semiconductor wafer 1 or to be slightly smaller than the target value. Thereby, the carrier 18 functions as a stopper for the polishing pads 16 and 17 during double side polishing, and droop at the outer periphery can be prevented from generating at the surface 2 and the back surface 3 as the surfaces to be polished of the semiconductor wafer 1.

When the semiconductor wafer 1 is polished, a plurality of carriers 18 are placed on the lower surface plate 12 while the upper surface plate 11 is being raised, and the semiconductor wafers 1 are inserted inside the resin rings 19 in the holes 20 of each carrier 18 one by one. Then, the upper surface plate 11 is lowered to give a predetermined pressure to each semiconductor wafer 1. In this state, the upper surface plate 11 and the lower surface plate 12 are rotated at a predetermined speed in a mutually reverse direction while a polishing liquid is being supplied between the upper surface plate 11 and the lower surface plate 12 from the polishing liquid supply systems 15. At this time, at least one of the outer gear 14 and the inner gear 13 is rotated at a predetermined speed.

Thereby, a plurality of carriers 18 between the upper surface plate 11 and the lower surface plate 12 revolve around the inner gear 13 while rotating, that is, perform planetary movement. Consequently, the semiconductor wafer 1 held in each carrier 18 is relatively moved to the polishing pads 16 and 17 in the polishing liquid, and the surface 2 is in sliding contact with a pad surface 16A of the polishing pad 16, and the back surface 3 is in sliding contact with a pad surface 17A of the polishing pad 17 as shown in FIG. 3 so that the surface 2 and the back surface 3 are polished at the same time. The polishing conditions are set such that a plurality of semiconductor wafers 1 can be uniformly polished.

In the double side polishing apparatus 10 as described above, the thickness of the carrier 18 is set to be substantially identical to the target value of the final thickness of the semiconductor wafer 1 and functions as a stopper for the carrier 18 so that droop at the outer periphery of the surface 2 and the back surface 3 of the semiconductor wafer 1 can be prevented. However, the shape of the center of the surface 2 and the back surface 3 of the semiconductor wafer 1 may be unstable due to the shape of the upper surface plate 11 and the lower surface plate 12 or an influence of the applied state of the polishing pads 16 and 17.

For example, the surface 2 and the back surface 3 of the semiconductor wafer 1 may be formed in a concave shape to be largely depressed as shown in FIG. 6-B. In this case, among indices GBIR and SBIR indicating the flatness of the surface 2 and the back surface 3 of the semiconductor wafer 1, particularly GBIR is as high as 0.41 μm to 0.957 μm, for example, as indicated by symbol B in FIG. 7 for the semiconductor wafers 1, and thus the flatness is not necessarily preferable. GBIR (Global Back-side Ideal Range) indicates a difference between the highest position and the lowest position of one of the surface 2 and the back surface 3 of the semiconductor wafer 1 with reference to the other thereof. SBIR is an abbreviation of Site Back-side Ideal Range.

Figure 4:
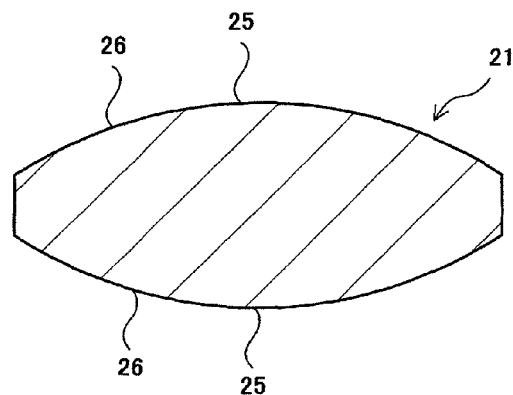
FIG. 4 is a cross-sectional view showing a form of a polishing pad shaping jig mounted on the double side polishing apparatus of FIG. 1.
Figure 8:
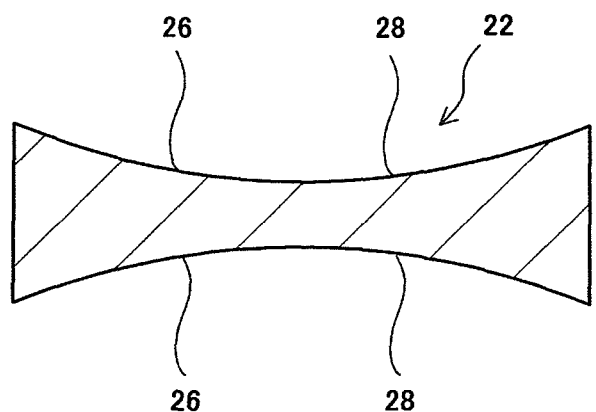
FIG. 8 is a cross-sectional view showing other form of the polishing pad shaping jig mounted on the double side polishing apparatus of FIG. 1.

In the present embodiment, for example, a polishing pad shaping jig 21, 22 shown in FIG. 4 or 8 is used for the double side polishing apparatus 10 to press and shape the shape of the pad surface 16A, 17A of the polishing pad 16, 17, respectively. Thereby, the polishing pads 16, 17 change the surface pressure acting on the surface 2 and the back surface 3 of the semiconductor wafer 1, respectively, while polishing both surfaces, and controls the shape of the surface 2 and the back surface 3 of the semiconductor wafer 1, thereby improving the flatness of the surface 2 and the back surface 3.

In other words, when the polishing pads before being shaped 16 and 17 are used to polish the surface 2 and the back surface 3 of the semiconductor wafer 1 by the double side polishing apparatus 10, if the shape of the surface 2 and the back surface 3 is concave to be largely depressed for an ideal shape 23 as shown in FIG. 6-B, there is prepared the polishing pad shaping jig 21 which shapes a shaping surface 25 (FIG. 4) in a convexed reverse shape 24 in which the shape of the surface 2 and the back surface 3 is reversed for the ideal shape 23.

The polishing pad shaping jig 21 is made of a metal such as aluminum, stainless steel or titanium, a semiconductor wafer such as silicon wafer, ceramics such as glass or stone, or resin such as glass epoxy resin. Particularly, for the polishing pad shaping jig 21, it is preferable that a hard coating layer 26 is coated on a surface made of the above metal, semiconductor wafer, glass, ceramics or resin and the shaping surface 25 is formed of the hard coating layer 26. The hard coating layer 26 is made of a material which is highly hard and excellent in wear resistance, such as DLC (Diamond Like Carbon) or TiN (titanium nitride).

When the polishing pad shaping jig 21 is made of a silicon wafer, the shape of the shaping surface 25 is formed by the double side polishing apparatus 10 by adjusting the polishing conditions. The polishing pad shaping jig 21 (the polishing pad shaping jig 22 described later) can be made of the semiconductor wafer 1 such as silicon wafer and the shaping surface 25, 28 can be made of the semiconductor wafer 1 by the double side polishing apparatus 10 under different condition setting, and the double side polishing apparatus 10 is used to transfer the shaping surface 25 (the shaping surface 28 described later) to the pad surface 16A, 17A and then to polish the semiconductor wafer 1 by the post-shaped polishing pads 16, 17 so that the semiconductor wafer 1 having the polished surfaces close to the ideal shape 23 described later can be formed with higher accuracy corresponding to the characteristics of the double side polishing apparatus 10.

When the polishing pad shaping jig 21 is made of a metal, the shape of the shaping surface 25 is formed by mechanical machining such as bending. In this way, the shape of the shaping surface 25 of the polishing pad shaping jig 21 may be made of the above metal, silicon or resin or may be formed of the hard coating layer 26. When the polishing pad shaping jig 21 (the polishing pad shaping jig 22 described later) is made of a metal, the polishing pads 16, 17 and the semiconductor wafer 1 can be contaminated by the metal but the shaping surface 25 (the shaping surface 28 described later) is coated with the hard coating layer 26, thereby preventing the possibility of the metal contamination.

Further, the polishing pad shaping jig 21 (the polishing pad shaping jig 22 described later) is formed to be integral with the carrier 18 which moves as described above along with the rotation of the surface plate (the lower surface plate 12) to which the polishing pad 16, 17 is applied while holding the polishing pad shaping jig 21, 22, and can transfer the shape of the shaping surface 25 (the shaping surface 28 described later) to the polishing pads 16, 17 in relative movement between the carrier 18 and the polishing pads 16, 17. The polishing pad shaping jig 21, 22 is made of the same material as the carrier 18 to be integrally formed therewith, thereby reducing cost.

There may be configured such that the carrier 18 is made of a plate such as PVC (Polyvinyl Chloride) and a member (having the same shape and the same arrangement as the polishing pad shaping jig 21 shown in FIG. 2, for example) such as metal (coated with the hard coating layer 26) having the shaping surface 25, 28 is applied to the position corresponding to the polishing pad shaping jig 21, 22. A plurality of members made of different materials may be applied to one carrier or may be exchanged depending on their specification. The members having the shaping surface 25, 28 do not need to have the outer shape in circular, and GBIR of the shaping surface is preferably on the order of 1 μm.

Figure 5:
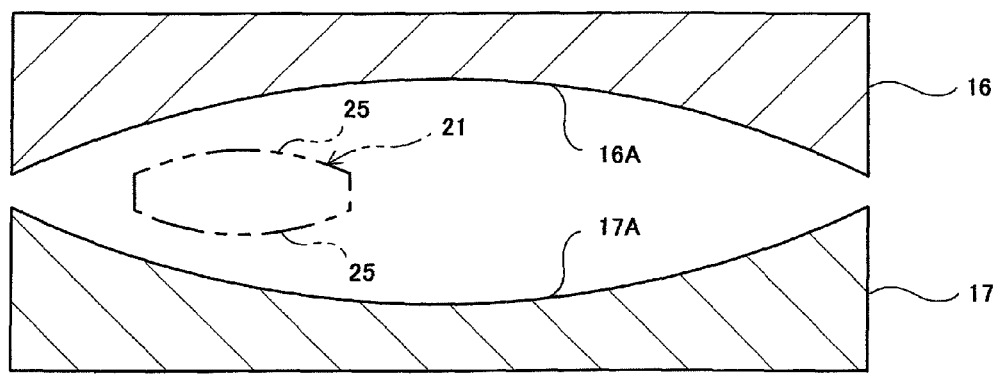
FIG. 5 is a cross-sectional view of polishing pads shaped by the polishing pad shaping jig of FIG. 4.

Next, the polishing pad shaping jig 21 configured in this way is inserted inside the resin ring 19 in the hole 20 of the carrier 18 of the double side polishing apparatus 10 shown in FIGS. 1 to 3 like when polishing the semiconductor wafer 1. In this state, the double side polishing apparatus 10 is operated like when polishing the semiconductor wafer 1. As shown in FIG. 5, the shape of the shaping surface 25 of the polishing pad shaping jig 21 is pressed and transferred on the pad surfaces 16A and 17A of the polishing pads 16 and 17, respectively, so that the pad surfaces 16A and 17A are formed to be concave.

In this manner, the pad surfaces 16A and 17A of the polishing pads 16 and 17 are shaped by the polishing pad shaping jig 21 and then the double side polishing apparatus 10 is stopped to take out the polishing pad shaping jig 21 from the carrier 18.

Thereafter, the semiconductor wafer 1 to be polished is inserted to be set inside the resin ring 19 in the hole 20 of the carrier 18 of the double side polishing apparatus 10 thereby to operate the double side polishing apparatus 10, and the polishing pads 16 and 17 whose pad surfaces 16A and 17A are shaped as described above are used to polish the surface 2 and the back surface 3 of the semiconductor wafer 1.

The polished surface 2 and back surface 3 of the semiconductor wafer 1 are concave to be lightly depressed (or convex to be lightly expanded, though not shown) for the ideal shape 23 as shown in FIG. 6-A. Consequently, the polished semiconductor wafers 1 have the flatness GBIR of 0.205 μm to 0.384 μm on the surface 2 and the back surface 3 as indicated by symbol A in FIG. 7. In other words, it can be seen that the flatness of the surface 2 and the back surface 3 of the semiconductor wafer 1 is largely improved after the pad surfaces 16A and 17A of the polishing pads 16 and 17 are shaped (symbol A in FIG. 7) than before being shaped (symbol B in FIG. 7).

The reason therefor is as stated below. In other words, since a surface pressure P1 acting on the surface 2 and the back surface 3 of the semiconductor wafer 1 from the polishing pads 16 and 17 during polishing is larger at the center of the surface 2 and the back surface 3 than the outer periphery thereof as shown in FIG. 6-B before the pad surfaces 16A and 17A of the polishing pads 16 and 17 are shaped, the center of the surface 2 and the back surface 3 of the semiconductor wafer 1 is concave to be largely depressed after polishing. To the contrary, since when the polishing pads 16 and 17 shaped by the polishing pad shaping jig 21 are used to polish the surface 2 and the back surface 3 of the semiconductor wafer 1, a surface pressure F1 acting on the surface 2 and the back surface 3 of the semiconductor wafer 1 from the polishing pads 16 and 17 during polishing is changed by substantially the same degree between the center and the outer periphery of the surface 2 and the back surface 3, the amount of depression (or the amount of expansion, though not shown) is smaller at the center of the surface 2 and the back surface 3 of the semiconductor wafer 1 after polishing and the surface 2 and the back surface 3 are formed in a concave shape to be lightly depressed close to the ideal shape 23 (or in a convex shape to be lightly expanded, though not shown).

When the polishing pads before being shaped 16 and 17 are used to polish the surface 2 and the back surface 3 of the semiconductor wafer 1 by the double side polishing apparatus 10, if the shape of the surface 2 and the back surface 3 is convex to be largely expanded for the ideal shape 23 as shown in FIG. 10-B, there is prepared the polishing pad shaping jig 22 whose shaping surface 28 (FIG. 8) is shaped in a concaved reverse shape 27 in which the shape of the surface 2 and the back surface 3 is reversed for the ideal shape 23. The polishing pad shaping jig 22 is preferably configured similar to the polishing pad shaping jig 21 shown in FIG. 4 and has the shaping surface 28 formed of the hard coating layer 26.

Figure 9:
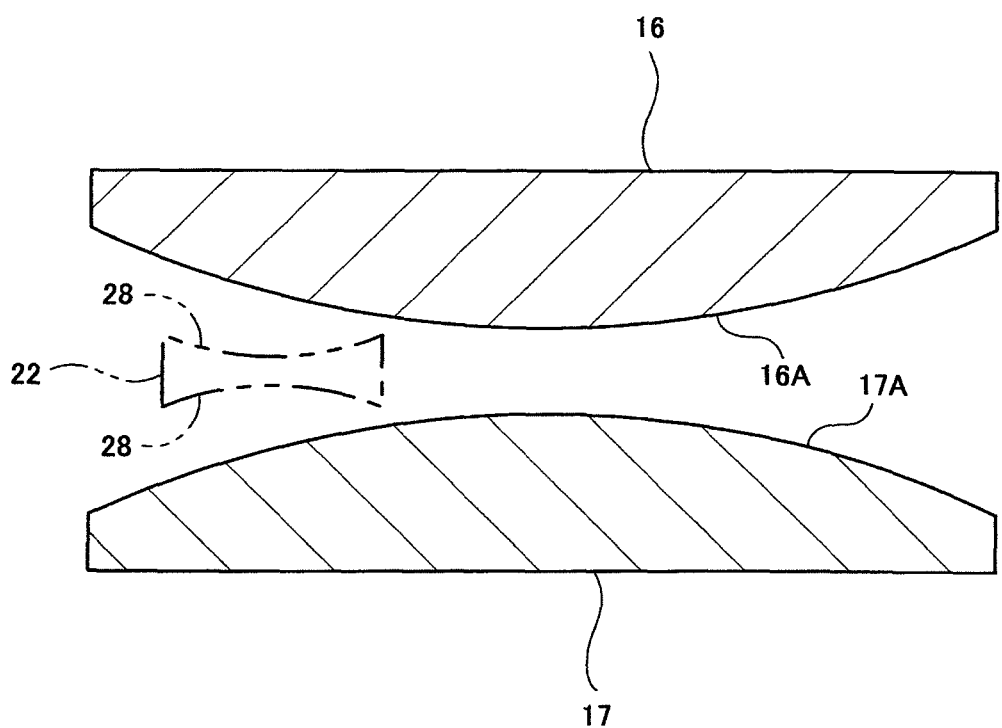
FIG. 9 is a cross-sectional view showing polishing pads shaped by the polishing pad shaping jig of FIG. 8.

Next, the polishing pad shaping jig 22 configured in this way is inserted inside the resin ring 19 in the hole 20 of the carrier 18 of the double side polishing apparatus 10 shown in FIGS. 1 to 3 like when polishing the semiconductor wafer 1. Then, in this state, the double side polishing apparatus 10 is operated like when polishing the semiconductor wafer 1. As shown in FIG. 9, the shape of the shaping surface 28 of the polishing pad shaping jig 22 is pressed and transferred on the pad surfaces 16A and 17A of the polishing pads 16 and 17 so that the pad surfaces 16A and 17A are formed to be convex.

In this manner, after the pad surfaces 16A and 17A of the polishing pads 16 and 17 are shaped by the polishing pad shaping jig 22, the double side polishing apparatus 10 is stopped to take out the polishing pad shaping jig 22 from the carrier 18.

Thereafter, the semiconductor wafer 1 to be polished is inserted to be set inside the resin ring 19 in the hole 20 of the carrier 18 of the double side polishing apparatus 10 thereby to operate the double side polishing apparatus 10, and the polishing pads 16 and 17 whose pad surfaces 16A and 17A are shaped as described above are used to polish the surface 2 and the back surface 3 of the semiconductor wafer 1.

The polished surface 2 and back surface 3 of the semiconductor wafer 1 are convex to be lightly expanded (or concave to be lightly depressed, though not shown) for the ideal shape 23 as shown in FIG. 10-A. Consequently, the flatness GBIR of the surface 2 and back surface 3 of the semiconductor wafer 1 is further improved than when the polishing pads before being shaped 16 and 17 are used similar to the case indicated by symbol A in FIG. 7.

The reason therefor is as stated below. Since a surface pressure P2 acting on the surface 2 and the back surface 3 of the semiconductor wafer 1 from the polishing pads 16 and 17 during polishing is larger at the outer periphery of the surface 2 and the back surface 3 than at the center thereof as shown in FIG. 10-B before the pad surfaces 16A and 17A of the polishing pads 16 and 17 are shaped, the center of the surface 2 and the back surface 3 of the semiconductor wafer 1 is convex to be largely expanded after polishing. To the contrary, when the polishing pads 16 and 17 shaped by the polishing pad shaping jig 22 are used to polish the surface 2 and the back surface 3 of the semiconductor wafer 1, a surface pressure F2 acting on the surface 2 and the back surface 3 of the semiconductor wafer 1 from the polishing pads 16 and 17 during polishing is changed by substantially the same degree between the center and the outer periphery of the surface 2 and the back surface 3 as shown in FIG. 10-A, and thus the center of the surface 2 and the back surface 3 of the semiconductor wafer 1 has the less amount of expansion (or the less amount of depression, though not shown) after polishing and the surface 2 and the back surface 3 have the convex shape to be lightly expanded close to the ideal shape 23 (or the concave shape to be lightly depressed, though not shown).

With the above structure, according to the present embodiment, the following effects (1) through (4) are obtained.

(1) The shape of the surface 2 and the back surface 3 of the semiconductor wafer 1 when being polished by the polishing pads before being shaped 16 and 17 is reversed for the ideal shape 23 to form the shaping surface 25, 28 of the polishing pad shaping jig 21, 22 and to transfer the shape of the shaping surface 25, 28 to the pad surfaces 16A and 17B of the polishing pads 16 and 17, and the polishing pads 16 and 17 to which the shape of the shaping surface 25, 28 of the polishing pad shaping jig 21, 22 is transferred are used to polish the surface 2 and the back surface 3 of the semiconductor wafer 1. Thus, the surface pressure F1, F2 acting on the surface 2 and the back surface 3 of the semiconductor wafer 1 by the polishing pads 16 and 17 whose pad surfaces 16A and 17A are shaped as described above is substantially uniform and optimized. Consequently, the surface 2 and the back surface 3 of the semiconductor wafer 1 can be polished by the polishing pads 16 and 17 at preferable flatness.

(2) When the hard coating layer 26 is provided on the shaping surface 25 of the polishing pad shaping jig 21 and the shaping surface 28 of the polishing pad shaping jig 22, since the hard coating layer 26 is highly hard and excellent in wear resistance, the polishing pad shaping jig 21 and 22 is set in the carrier 18 of the double side polishing apparatus 10 to shape the pad surfaces 16A and 17A of the polishing pads 16 and 17 so that a desired shape of the pad surfaces 16A and 17A can be formed with high accuracy.

(3) When the double side polishing apparatus 10 can be used to make the polishing pad shaping jig 21, 22 of the semiconductor wafer 1 such as silicon wafer and to form the shaping surface 25, 28 of the semiconductor wafer 1 under different condition setting, the double side polishing apparatus 10 is used to transfer the shaping surface 25, 28 to the pad surface 16A, 17A and then to polish the semiconductor wafer 1 by the shaped polishing pad 16, 17, thereby forming the semiconductor wafer 1 having the polished surfaces close to the ideal shape 23 with higher accuracy corresponding to the characteristics of the double side polishing apparatus 10.

(4) The polishing pad shaping jig 21, 22 is formed to be integral with the carrier 18 which moves as described above along with the rotation of the surface plate (the lower surface plate 12) to which the polishing pad 16, 17 is applied while holding the polishing pad shaping jig 21, 22, and the shape of the shaping surface 25, 28 can be transferred to the polishing pad 16, 17 in relative movement between the carrier 18 and the polishing pads 16, 17. The polishing pad shaping jig 21, 22 is made of the same material as the carriers 18 to be integrally formed therewith, thereby reducing cost.

The present invention has been described above by way of the present embodiment, but the present invention is not limited thereto. For example, there has been described for the present embodiment the case in which the polishing apparatus is the double side polishing apparatus 10, but a one-surface polishing apparatus for polishing only either one of the surface 2 and the back surface 3 of the semiconductor wafer 1 may be applied to the present invention.

Thereby, the present invention can be utilized as the semiconductor wafer polishing method and the polishing pad shaping jig capable of polishing surfaces to be polished of the semiconductor wafer with preferable flatness.

The invention claimed is:

1. A semiconductor wafer polishing method for polishing surfaces to be polished of a semiconductor wafer by polishing pads through relative movement between the polishing pads and the semiconductor wafer, comprising:
    reversing the shape of the polished surfaces of the semiconductor wafer when being polished by the polishing pads for an ideal shape, thereby forming a shaping surface of a polishing pad shaping jig;
    transferring the shape of the shaping surface of the polishing pad shaping jig to the polishing pads; and
    polishing the surfaces to be polished of the semiconductor wafer by the post-shaped polishing pads.

2. The semiconductor wafer polishing method according to claim 1, wherein when the shape of the polished surfaces of the semiconductor wafer when being polished by the polishing pads before being shaped is concave for the ideal shape, the polished surfaces are reversed for the ideal shape to form the shaping surface of the polishing pad shaping jig in a convex shape, and the shaping surface is transferred to form the polishing pads in a concave shape.

3. The semiconductor wafer polishing method according to claim 1, wherein when the shape of the polished surfaces of the semiconductor wafer when being polished by the polishing pads before being shaped is convex for the ideal shape, the polished surfaces are reversed for the ideal shape to form the shaping surface of the polishing pad shaping jig in a concave shape, and the shaping surface is transferred to form the polishing pads in a convex shape.

4. A polishing pad shaping jig which is mounted on a semiconductor wafer polishing apparatus in order to change a surface pressure acting on a semiconductor wafer to be polished by polishing pads, and which is directed for pressing and shaping the polishing pads the jig comprising, a shaping surface having a shape that is the reserve of the shape of the polished surfaces of the semiconductor wafer polished by the polishing pads before being shaped, for the ideal shape of the semiconductor wafer.

5. The polishing pad shaping jig according to claim 4, wherein the shaping surface is formed of a semiconductor wafer capable of being polished by the polishing pads.

6. The polishing pad shaping jig according to claim 4, which is formed to be integral with a carrier moving along with the rotation of a surface plate to which the polishing pad is applied while holding the polishing pad shaping jig, and which transfers the shape of the shaping surface to the polishing pads in relative movement between the carrier and the polishing pads.

7. A polishing pad shaping jig which is mounted on a semiconductor wafer polishing apparatus in order to change a surface pressure acting on a semiconductor wafer to be polished by polishing pads, and which is directed for pressing and shaping the polishing pads the jig comprising, a shaping surface having a shape that is the reverse of the shape of the polished surfaces of the semiconductor wafer polished by the polishing pads before being shaped, for the ideal shape of the semiconductor wafer; and a hard coating layer provided on the shaping surface.

8. The polishing pad shaping jig according to claim 7, wherein the shaping surface is formed of a semiconductor wafer capable of being polished by the polishing pads.

9. The polishing pad shaping jig according to claim 7, which is formed to be integral with a carrier moving along with the rotation of a surface plate to which the polishing pad is applied while holding the polishing pad shaping jig, and which transfers the shape of the shaping surface to the polishing pads in relative movement between the carrier and the polishing pads.

* * * * *